(12) United States Patent
Bawa et al.

(10) Patent No.: US 8,754,699 B2
(45) Date of Patent: Jun. 17, 2014

(54) SWITCHED-CAPACITOR FILTER

(75) Inventors: Gaurav Bawa, Raleigh, NC (US);
William Todd Harrison, Apex, NC (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/288,783

(22) Filed: Nov. 3, 2011

(65) Prior Publication Data

US 2013/0113550 A1   May 9, 2013

(51) Int. Cl.
   *H03K 5/00*   (2006.01)

(52) U.S. Cl.
   USPC ............... 327/337; 327/554; 327/552

(58) Field of Classification Search
   USPC ............... 327/94, 551–559, 336–337
   See application file for complete search history.

(56) References Cited

U.S. PATENT DOCUMENTS

| 4,210,872 | A |   | 7/1980 | Gregorian |
| 4,894,620 | A |   | 1/1990 | Nagaraj |
| 4,926,178 | A | * | 5/1990 | Mallinson ............ 341/143 |
| 5,091,956 | A |   | 2/1992 | Miki |
| 7,138,873 | B2 | * | 11/2006 | Chandra et al. ........... 330/303 |
| 7,525,078 | B2 | * | 4/2009 | Fann ............... 250/208.1 |
| 8,406,357 | B2 | * | 3/2013 | Yamazaki et al. .......... 375/350 |

OTHER PUBLICATIONS

Barrie Gilbert, "The Multi-tanh Principle: A Tutorial Overview," in IEEE Journal of Solid-State Circuits, vol. 33, No. 1, Jan. 1998, pp. 2-17.

R. Gregorian and W. E. Nicholson, Jr., "MOS sampled-data high-pass filters using switched-capacitor integrators," Microelectronics Journal, vol. 11, No. 2, 1980 Mackintosh Publications Ltd., Luton, pp. 22-25.

R. Gregorian and W. E Nicholson, Jr., "A Switched-Capacitor High-Pass Filter," IEEE Transactions on Circuits and Systems, vol. CAS-27, No. 3, Mar. 1980, pp. 226-229.

R. Gregorian, "Switched-Capacitor Filter Design Using Cascaded Sections," IEEE Transactions on Circuits and Systems, vol. CAS-27, No. 6, Jun. 1980, pp. 515-521.

Ken Kundert, "Simulating Switched-Capacitor Filters with SpectreRF," www.designers-guide.org, Copyright 2005, pp. 1-24.

J.J.F. Rijns, "54MHz switched-capacitor video channel equaliser," Electronic Letters, Dec. 9, 1993, vol. 29, No. 25, pp. 2181-2182.

J.J.F. Rijns and H. Wallinga, "Spectral Analysis of Double-Sampling Switched-Capacitor Filters," IEEE Transactions on Circuits and Systems, vol. 38, No. 11, Nov. 1991, pp. 1269-1279.

Willy M.C. Sansen and Peter M. Van Peteghem, "An Area-Efficient Approach to the Design of Very-Large Time Constants in Switched-Capacitor Integrators," IEEE Journal of Solid-State Circuits, vol. SC-19, No. 5, Oct. 1984, pp. 772-780.

(Continued)

*Primary Examiner* — Dinh T. Le
(74) *Attorney, Agent, or Firm* — William B. Kempler; Wade J. Brady, III; Frederick J. Telecky, Jr.

(57) ABSTRACT

A filter is implemented as cascaded stages, and in at least one stage all resistances are implemented as double-sampled switched-capacitor circuits. In a variation, at least one resistance is implemented as a double-sampled switched-capacitor T-network. In a variation, in an integrator stage, a resistance is implemented as a transconductance, and the cutoff frequency of the integrator stage scales with a switching frequency of a DC-DC voltage converter.

12 Claims, 8 Drawing Sheets

(56) References Cited

OTHER PUBLICATIONS

Gabor C. Temes, J. Orchard, and Masood Jahanbegloo, "Switched-Capacitor Filter Design Using the Bilinear z-Transform," IEEE Transactions on Circuits and Systems, vol. CAS-25, No. 12, Dec. 1978, pp. 1039-1044.

R. R. Torrance, T. R. Viswanathan and J. V. Hanson, "CMOS Voltage to Current Transducers," IEEE Transactions on Circuits and Systems, vol. CAS-32, No. 11, Nov. 1985, pp. 1097-1104.

* cited by examiner

SWITCHED-CAPACITOR FILTER

BACKGROUND

DC-DC (direct current) converters convert DC power at one voltage to DC power at a different voltage. DC-DC converters commonly include a feedback amplifier, also called a compensation filter, where "compensation" means that the feedback network gain and phase as a function of frequency ensure that the overall system with feedback is stable. The feedback signal may be voltage or current, and there may be multiple feedback loops.

FIG. 1 illustrates an example DC-DC converter 100. The DC-DC converter illustrated is a switching step-down converter (the output voltage is less than the input voltage). The particular topology is called a Buck converter. Buck converters are particularly suitable for power supplies for battery powered low-voltage microprocessor and microcontroller applications. The circuit illustrated in FIG. 1 converts DC power from voltage $V_{IN}$ to DC power for a load R at voltage $V_{OUT}$. When switch $SW_1$ is closed, a first end of inductor L is at $V_{IN}$, and when switch $SW_2$ is closed, the first end of inductor L is at ground. The inductor L stores energy and prevents instantaneous current change. A capacitor C stores energy and prevents instantaneous voltage change, thereby reducing output voltage ripple. In the example circuit 100, output voltage $V_{OUT}$ is compared to a reference voltage $V_{REF}$ by a feedback compensation filter 102. A ramp generator 104 is driven by a clock signal CLK. A comparator 106 compares the output of the compensation filter 102 to the ramp signal. A driver circuit 108 closes $SW_1$ at the start of each clock cycle, and the point at which the comparator 106 switches determines the width of a pulse driving $SW_1$. During the remainder of the clock cycle, the driver 108 closes switch $SW_2$.

In general, there is a need to extend the high frequency response of a DC-DC converter system while maintaining stability. This is especially important, for example, in applications where significant loads such as microprocessors and microcontrollers may be frequently switched in and out of standby mode to reduce power. There are three commonly implemented compensation filters for Buck converters, which are classified according to their bandwidth and their gain and phase response as a function of frequency. A Type-I filter is essentially an integrator, providing good DC voltage or DC current regulation at a relatively low bandwidth. A Type-II filter extends the bandwidth and provides a phase shift to ensure stability at the extended bandwidth. A Type-III filter further extends the bandwidth and provides additional phase shift.

A compensation filter may be implemented as an analog circuit (with external discrete analog components or with integrated analog components). Alternatively, a compensation filter may be implemented as an all-digital circuit. For analog implementations, each higher filter type requires additional passive components (resistors and capacitors). Typically, for analog implementations, many of the passive components are external discrete components, which require space and the additional cost of mounting. Alternatively, the passive analog components may be integrated, but this usually requires significant integrated circuit space and expense. In addition, time constants for filters with integrated analog components may vary by +/−40%, requiring extensive trimming, which increases cost and processing time. In addition, all of the component values need to be variable because all the filter time constants need to track the switching frequency of the Buck converter. For an all-digital implementation, the analog output signal may be converted to digital signals with an analog-to-digital converter, the resulting digital signals may be processed by a digital-signal-processor, and the resulting digital signals may be converted to analog signals by a digital-to-analog converter. Typically, an all-digital filter circuit is physically smaller than an analog circuit, but consumes more power.

There is an ongoing need for improved compensation filters.

DETAILED DESCRIPTION

Figure 1:
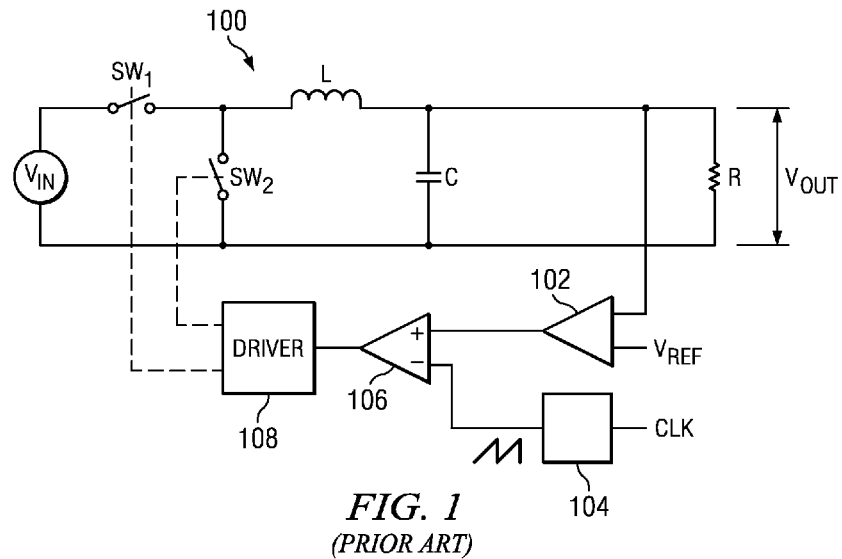
FIG. 1 is a simplified block diagram illustrating an example embodiment of a prior art DC-DC Buck Converter.
Figure 2:
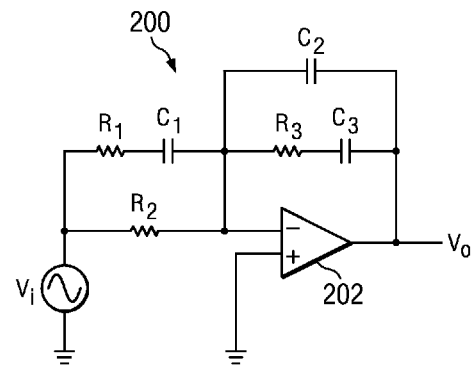
FIG. 2 is a schematic illustrating an example embodiment of a prior art analog Type-III compensation filter.

FIG. 2 illustrates an example analog Type-III compensation filter. FIG. 2 is an example of element 102 in FIG. 1. Note that Vi for the circuit in FIG. 2 may be, for example, Vout in FIG. 1. In the frequency domain, the gain of the circuit in FIG. 2 is as follows:

$$\text{GAIN} = -\frac{[1 + sC_1(R_1 + R_2)][1 + sR_3C_3]}{[sR_2(C_2 + C_3)][1 + sR_1C_1]\left[1 + sR_3\left(\frac{C_2C_3}{C_2 + C_3}\right)\right]}$$

In the frequency domain, the circuit in FIG. 2 is said to have two zeros (frequencies at which the ideal gain or transfer function is equal to zero, the factors in the numerator), and three poles (frequencies at which the ideal gain or transfer function is infinite, the factors in the denominator).

Typically, each of the resistors ($R_1$, $R_2$, $R_3$) in FIG. 2 are discrete resistors mounted externally to an integrated circuit. Alternatively, the resistors may be integrated as large areas within an integrated circuit, employing the sheet resistance of semiconductor materials.

Figure 3A:
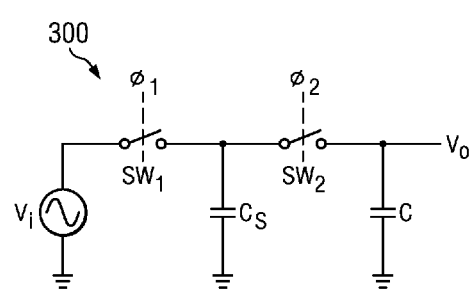
FIG. 3A is a simplified block diagram illustrating an example embodiment of a prior art switched-capacitor implementation of a resistor.

In some circumstances, resistors may be implemented as a switched-capacitor circuit. FIG. 3A illustrates an example switched-capacitor implementation of a resistor. A capacitor $C_S$ is alternately switched between an input voltage Vi and an output voltage Vo. Two non-overlapping clock phases ($\emptyset_1$, $\emptyset_2$) alternately drive two switches $SW_1$ and $SW_2$. During phase 1, the charge $Q_{cs}$ flowing from Vi to $C_S$ is $Vi*C_S$. During phase 2, the charge $Q_{CS}$ flowing from Vo to $C_S$ is $Vo*C_S$. The net charge $\Delta Q$ flowing from Vi is $(Vi-Vo)*C_S$. The average current flowing from Vi is the change in charge during one clock period divided by the clock period, $(Vi-Vo)*(C_S/T_{CLK})$. The equivalent resistance of the network is the change in voltage divided by the average current, $(Vi-Vo)/[(Vi-Vo)*(C_S/T_{CLK})]=T_{CLK}/C_S$.

Figure 3B:
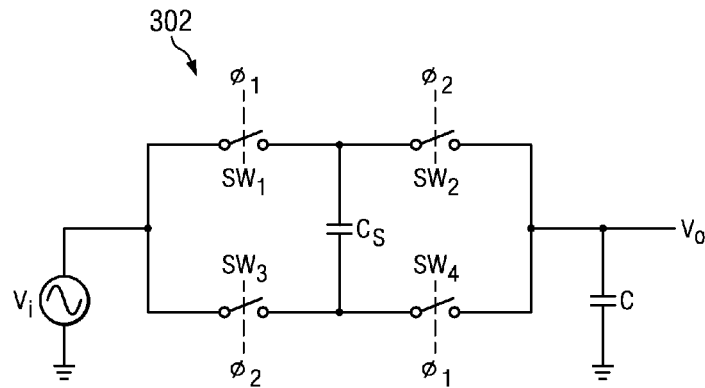
FIG. 3B is a simplified block diagram illustrating an example embodiment of a prior art double-sampled switched-capacitor implementation of a resistor.

In the switched-capacitor circuit 300 of FIG. 3A, the input voltage is connected to the sampling capacitor only half the time (during phase 1 of the clock) and the output voltage is connected to the sampling capacitor only half of the time (during phase 2 of the clock). In an alternative design, called double-sampling, the input and output are sampled at each clock phase. In an ideal circuit, double-sampling doubles the sampling rate and doubles the bandwidth of the circuit. FIG. 3B illustrates a resistance implemented as a double-sampled switched-capacitor circuit. In the switched-capacitor circuit 302 of FIG. 3B, during phase 1 of the clock, switch $SW_1$ connects one end of $C_S$ to Vi and switch $SW_4$ connects the other end to Vo. During phase 2 of the clock, switches $SW_2$ and $SW_3$ are closed and the ends of $C_S$ are reversed. Because the charge on $C_S$ is reversed, the amount of charge transferred is doubled. During each phase of the clock, the net charge being transferred from Vi is $2*(Vi-Vo)*C_S$. The net charge transferred during one clock period is $4*(Vi-Vo)*C_S$. The effective resistance is the change in voltage divided by the current, which is $T_{CLK}/4C_S$. The capacitance $C_S$ in the circuit in FIG. 3B is one-fourth the capacitance $C_S$ in the circuit in FIG. 3A for the same equivalent resistance. In addition, the circuit in FIG. 3B is parasitic-insensitive.

Figure 3C:
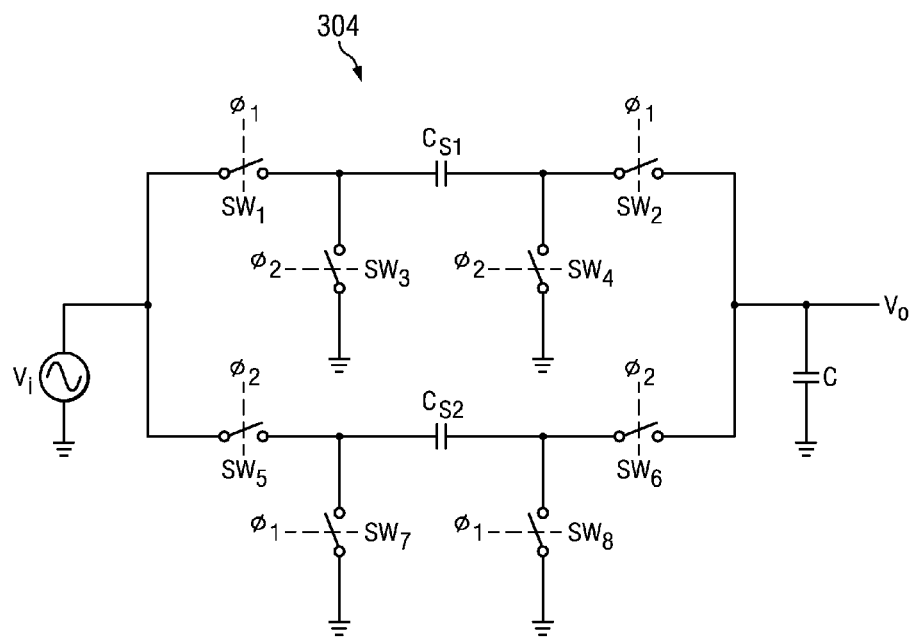
FIG. 3C is a simplified block diagram illustrating an alternative example embodiment of a prior art double-sampled switched-capacitor implementation of a resistor.

FIG. 3C illustrates another alternative circuit 304 for implementing a resistance as a double-sampled switched-capacitor circuit. The circuit of FIG. 3C is particularly suitable for very large time constants. In the circuit of FIG. 3C, during phase 1 of the clock, switches $SW_1$ and $SW_2$ connect capacitor $C_{S1}$ between Vi and Vo. During phase 2 of the clock, switches $SW_5$ and $SW_6$ connect capacitor $C_{S2}$ between Vi and Vo. During phase 2, switches $SW_3$ and $SW_4$ discharge $C_{S1}$, and during phase 1, switches $SW_7$ and $SW_8$ discharge $C_{S2}$. Assuming $C_{S1}=C_{S2}$, during each phase of the clock, the net charge being transferred from Vi is $(Vi-Vo)*C_{Si}$, and the effective resistance is $T_{CLK}/2C_{S1}$.

Figure 3D:
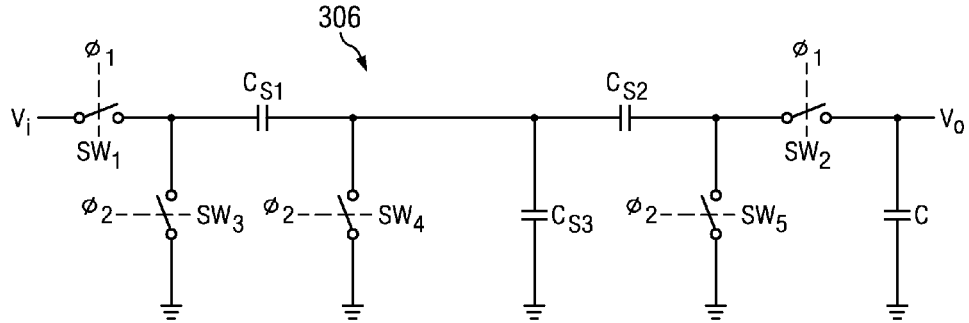
FIG. 3D is a simplified block diagram illustrating an example embodiment of a prior art switched-capacitor T-network implementation of a resistor.

FIG. 3D illustrates another alternative circuit 306 for implementing a resistance as a switched capacitor circuit. The embodiment in FIG. 3D is a switched T-network. During phase 1 of the clock, switches $SW_1$ and $SW_2$ are closed, and charge transfers between Vi and Vo. During phase 2 of the clock, switches $SW_3$, $SW_4$, and $SW_5$ are closed, and all the capacitors are discharged. The effective resistance is:

$$\left[1 + \frac{C_{S1}}{C_{S3}} + \frac{C_{S2}}{C_{S3}}\right] * \frac{C_{S3}}{C_{S1}C_{S2}} * T_{CLK}$$

Typically, for any given resistance R, the integrated circuit area required for a switched-capacitor implementation is much smaller than the integrated circuit area required for an integrated analog resistance. In addition, the variability of the resistance for a switched-capacitor implementation is much less than the variability of an integrated analog resistance, eliminating the need for a trimming process. For the circuit in FIG. 2, it would be desirable to implement $R_1$, $R_2$, and $R_3$ with switched-capacitor circuits as in FIG. 3A, 3B, 3C, or 3D to eliminate the need for external resistors or large integrated resistors. However, note that the switched-capacitor circuits in FIGS. 3A, 3B, 3C, and 3D require a voltage source (Vi, Vo) at both the input and the output. Note that ground or a virtual ground qualifies as a voltage source. In FIG. 2, $R_1$ is in series with capacitor $C_1$, and $R_3$ is in series with capacitor $C_3$. If for example, the circuit of FIG. 3A is implemented for $R_1$ of FIG. 2, during phase $\emptyset_2$, the output of the switched-capacitor circuit will be connected to one end of a floating capacitor $C_1$, which does not provide a voltage source. In the embodiment of FIG. 2, only $R_2$ can be implemented as a switched-capacitor equivalent.

Figure 4:
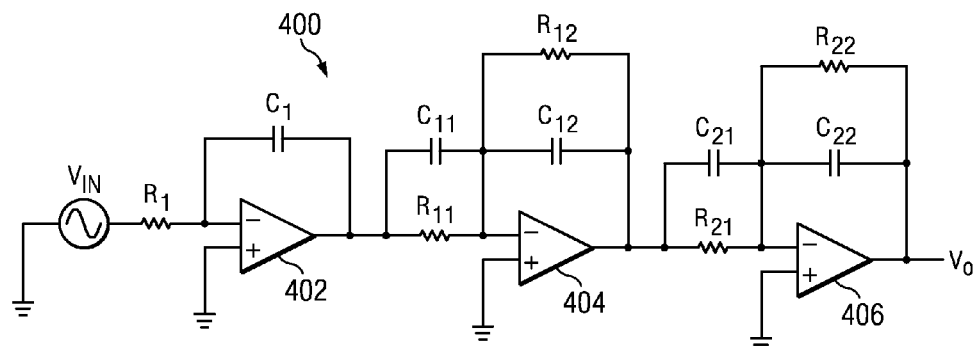
FIG. 4 is a simplified block diagram illustrating an example embodiment of an analog Type-III compensation filter implemented as a cascade of multiple filters.

FIG. 4 illustrates an alternative analog Type-III filter (circuit 400). In the embodiment of FIG. 4, there is a cascade of multiple stages instead of one stage. A first stage (operational amplifier 402) implements one pole, and each additional stage (operation amplifiers 404 and 406) implements one pole and one zero. The product of the three gains for the configuration in FIG. 4 can be made equal to the gain for the configuration in FIG. 2. Implementing a Type-III filter as cascaded stages as in FIG. 4 is counter-intuitive because the end result requires ten passive components compared to six passive components in the circuit of FIG. 2. However, cascading and the topology of the last two stages enables implementation as a switched-capacitor filter, and other advantages, as discussed below.

For the configuration in FIG. 4, the gain of the stages, from left to right, is as follows:

$$GAIN1 = -\frac{1}{sR_1C_1}$$

$$GAIN2 = -\frac{R_{12}}{R_{11}} * \frac{1+sR_{11}C_{11}}{1+sR_{12}C_{12}}$$

$$GAIN3 = -\frac{R_{22}}{R_{21}} * \frac{1+sR_{21}C_{21}}{1+sR_{22}C_{22}}$$

Consider, for example, stage 2. At very low frequencies, the gain is approximately $-R_{12}/R_{11}$. At very high frequencies, the gain is approximately $-C_{11}/C_{12}$. The shape of the frequency response at intermediate frequencies depends on the relative sizes of $R_{11}$, $R_{12}$, $C_{11}$, and $C_{12}$. Assume, for example, $R_{11}=R_{12}$ and $C_{11}>C_{12}$. If $R_{11}=R_{12}$, then the low frequency gain is 1.0. As frequency increases, the impedance of $C_{11}$ becomes less than $R_{11}$, and gain increases to be greater than 1.0. As frequency increases further, the impedance of $C_{12}$ becomes less than $R_{12}$, and the gain flattens at $-C_{11}/C_{12}$. Accordingly, as filter stages for a Type-III compensation filter, each of last two stages can be characterized as a high-pass filter with a non-zero DC gain. The topology of each of the last two stages in FIG. 4 is not a common topology for a high-pass filter (typical high-pass filters have a capacitor in series with the input so that the DC gain is zero). However, the topology of the last two stages provides advantages for implementation as a switched-capacitor filter, as discussed below.

The configuration in FIG. 4 has multiple advantages over the configuration in FIG. 2, as follows:

1. As a result of using a cascade of stages, and using a filter configuration for each stage in which each of the resistors has a voltage source at each end, all of the resistors can be implemented as switched-capacitor equivalents. Implementing the resistors in an analog filter as switched-capacitor equivalents eliminates the need for external discrete resistors, reduces the integrated circuit area relative to integrated analog resistors, provides a small variation in time constants relative to integrated analog resistors, consumes less power than an all-digital implementation, and enables all the filter time constants to track the DC-DC converter switching frequency without requiring trimming.

2. The pole and zero frequencies of each stage of the configuration in FIG. 4 can be made independent of the pole and zero frequencies of the other stages. Of particular interest, the first stage of the configuration in FIG. 4 can have a cutoff frequency for anti-aliasing that is independent of the poles and zeros in the other two stages.

3. Where appropriate, the third stage can be omitted for reduced space and power, and the design and layout of the first two stages can be used as a Type-II compensation filter.

There are three optional further enhancements that can be made, as follows:

1. Capacitor $C_{21}$ is relatively large, and it places a power constraint on the high-bandwidth amplifier 404 for the second stage. The size of $C_{21}$ can be reduced by implementing $R_{21}$ as a doubled-sampled switched-capacitor T-network.

2. In the circuit in FIG. 4, there is a leakage path through the four capacitors in the last two stages ($C_{11}$, $C_{12}$, $C_{21}$, and $C_{22}$). One example way to break this leakage path is to insert a sample and hold circuit.

3. The first stage needs to provide an anti-aliasing function and the cutoff frequency needs to scale with the switching frequency of the Buck converter. Instead of implementing $R_1$ as a switched-capacitor equivalent, a transconductance amplifier may be used to provide continuous-time anti-aliasing with a scalable cutoff frequency for the first stage.

Figure 5:
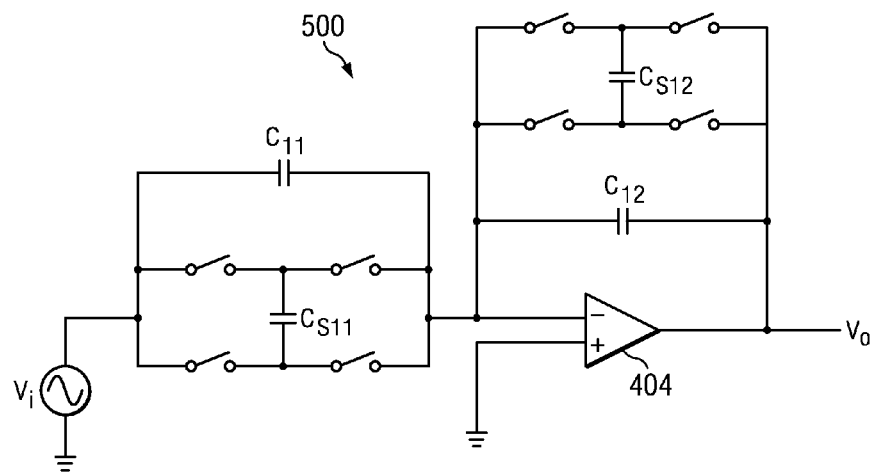
FIG. 5 is a simplified block diagram illustrating an example switched-capacitor embodiment of part of the analog Type-III compensation filter of FIG. 4.

FIG. 5 illustrates an example embodiment of the second stage of FIG. 4 with each of the resistors implemented as double-sampled switched-capacitor circuits as in FIG. 3B. Specifically, resistor $R_{11}$ in FIG. 4 is implemented as a switched-capacitor circuit (with capacitor $C_{S11}$) in the embodiment of FIG. 5, and resistor $R_{12}$ in FIG. 4 is implemented as a switched-capacitor circuit (with capacitor $C_{S12}$) in the embodiment of FIG. 5.

In the circuit in FIG. 4, in the third stage, $C_{21}$ is relatively large as a result of the required frequency of the zero determined by $R_{21}*C_{21}$ for a Type-III compensation filter. Accordingly, $C_{21}$ in the third stage imposes a high-frequency load on the second stage operational amplifier 404. If $C_{21}$ is made smaller, then $R_{21}$ needs to made larger to maintain the zero frequency determined by $R_{21}*C_{21}$. If $R_{21}$ is implemented as a switched-capacitor circuit as in FIG. 3A or 3B, then $R_{21}$ is proportional to $1/C_S$ where Cs is a switched-capacitor, and the zero frequency is then proportional to $C_{21}/C_S$. For example, consider the embodiment of the second stage in FIG. 5, where the zero frequency for the second stage is determined by $C_{11}/C_{S11}$. Accordingly, in the example of the second stage in FIG. 5, if $C_{11}$ is to be made smaller, then the switched-capacitor $C_{S11}$ needs to be made smaller. However, if $C_{S11}$ is made too small, then parasitic capacitances become relatively more significant. In addition, if $C_{S11}$ is made very small, then it becomes difficult to match capacitors, which is important to ensure a low variability of filter time constants.

Figure 6:
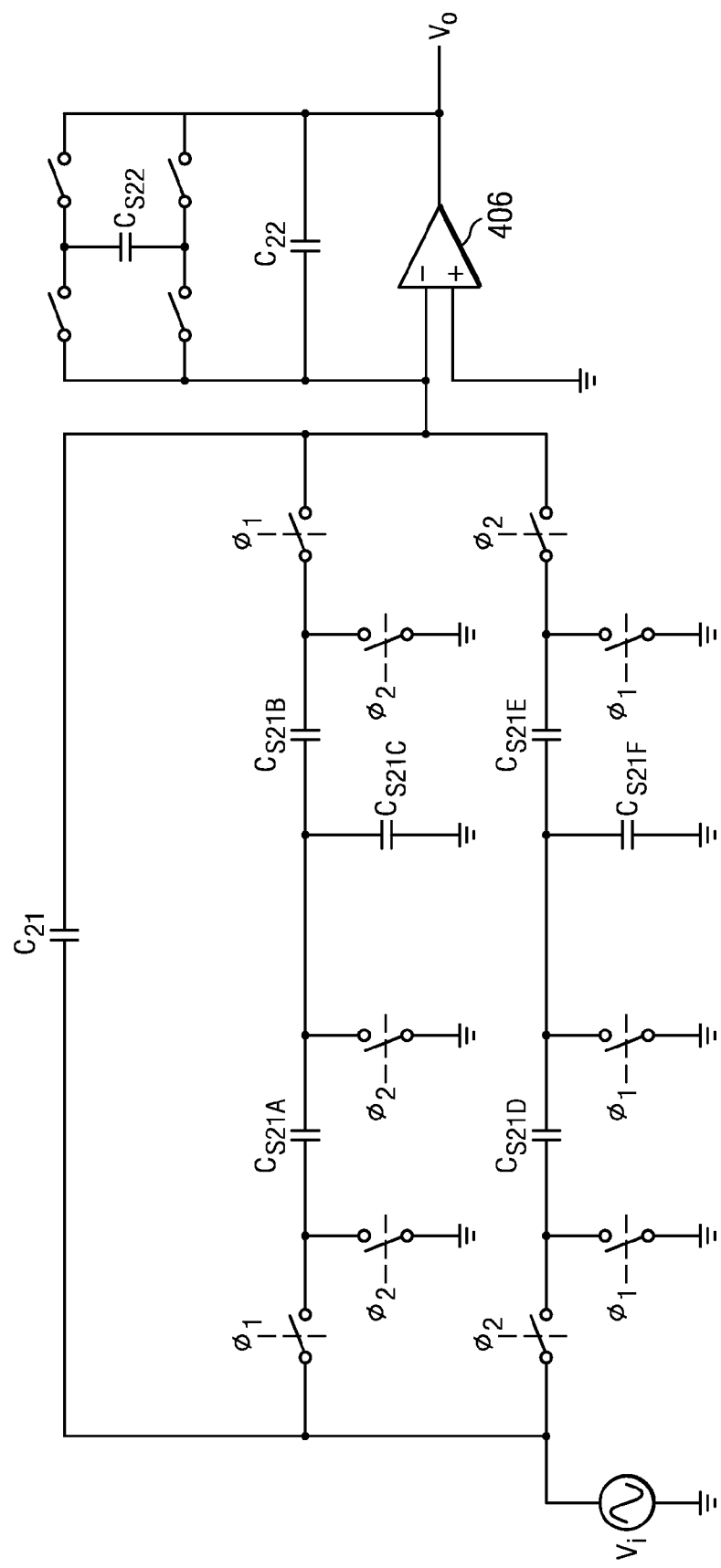
FIG. 6 is a simplified block diagram illustrating an example switched capacitor embodiment of part of the analog Type-III compensation filter of FIG. 4.

FIG. 6 illustrates an example embodiment of the third stage of FIG. 4, in which $R_{21}$ in FIG. 4 is implemented as a double-sampled switched-capacitor circuit as in FIG. 3C, but with two switched-capacitor T-networks ($C_{S21A}$–$C_{S21F}$) as in FIG. 3D instead of single switched capacitors. In addition, in the embodiment of FIG. 6, $R_{22}$ in FIG. 4 has been implemented as a double-sampled switched-capacitor circuit ($C_{S22}$) as in FIG. 3B. If $R_{21}$ is implemented as a double-sampled switched-capacitor T-network, then the zero frequency becomes a function of the product of two capacitor ratios, providing substantially more design freedom on the range of capacitor sizes. That is, the switched-capacitor implementation of $R_{21}$ can be made larger (and $C_{21}$ can be made smaller) without requiring the switched-capacitors to become so small that parasitic capacitances become a problem, and without requiring the switched-capacitors to become so small that capacitor matching becomes a problem. For the embodiment of FIG. 6, assume for example, $C_{S21A}=C_{S21D}$, $C_{S21B}=C_{S21E}$, and $C_{S21C}=C_{S21F}$. With these assumptions, the gain (in sampling z domain) of the stage is:

$$\text{GAIN}(z) = -\frac{C_{21}}{C_{22}} * \frac{1 + \frac{C_{S21A}}{C_{21}} * \frac{C_{S21B}}{C_{S21C}} * \frac{1}{\left(\frac{C_{S21B}}{C_{S21C}} + \frac{C_{S21A}}{C_{S21C}} + 1\right)} * \frac{1}{1-z^{-1}}}{1 + \frac{C_{S22}}{C_{22}} * \frac{1+z^{-1}}{1-z^{-1}}}$$

In the embodiment of FIG. 5, the zero frequency for the second stage is determined by $C_{11}/C_{S11}$. In the embodiment of FIG. 6, the zero frequency for the third stage is determined by $(C_{S21A}/C_{21})*(C_{S21B}/C_{S21C})$. Accordingly, by adjusting the relative sizes of $C_{S21A}$, $C_{S21B}$, and $C_{S21C}$, $C_{21}$ can be made smaller, and the equivalent of $R_{21}$ can be made larger, without making $C_{21}$ so small that parasitic effects become significant and without making $C_{21}$ so small that matching becomes difficult. For a specific example embodiment, using double-sampled switched-capacitor T-networks for $R_{21}$ enables $C_{21}$ to be reduced by a factor of 8, and enables the overall capacitive load on the preceding stage operational amplifier to be reduced by a factor of more than 5.

Figure 7A:
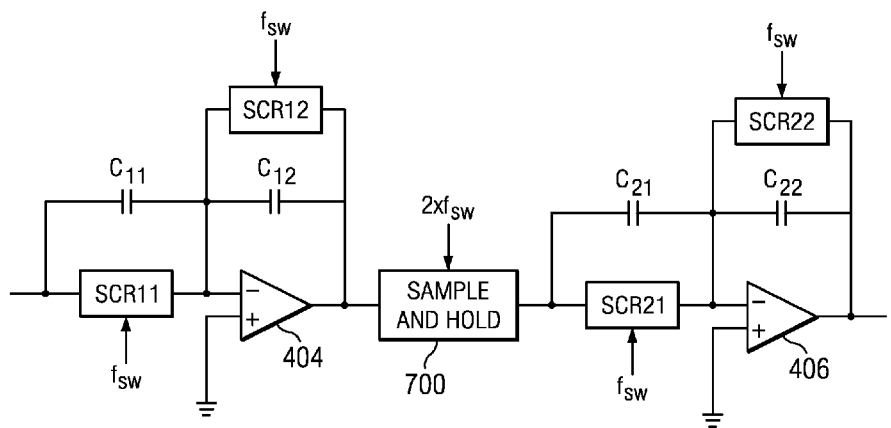
FIG. 7A is a simplified block diagram illustrating an example embodiment of a variation of part of the analog Type-III compensation filter of FIG. 4.
Figure 7B:
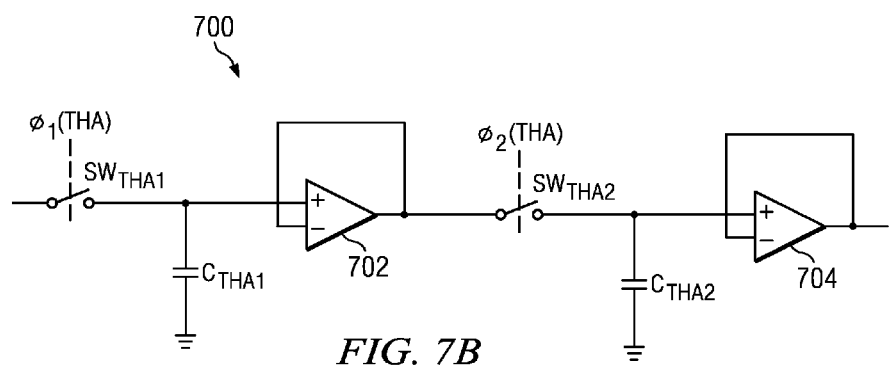
FIG. 7B is a simplified block diagram illustrating additional detail for an example embodiment of part of FIG. 7A.
Figure 7C:
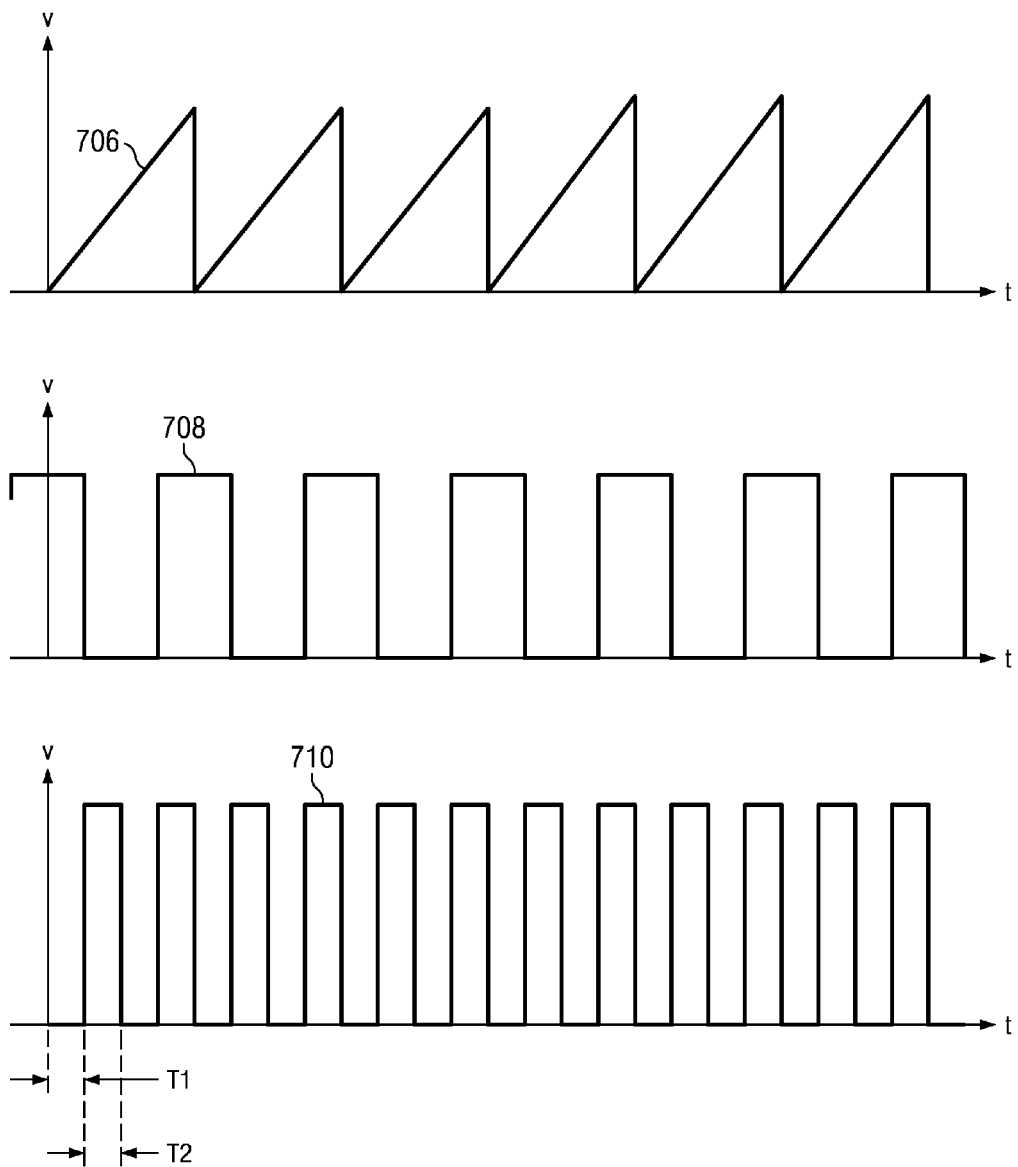
FIG. 7C is a timing diagram illustrating example timing for part of the circuit illustrated in FIG. 7A.

In the embodiment of FIG. 4, there is a leakage path through the four capacitors in the last two stages ($C_{11}$, $C_{12}$, $C_{21}$, and $C_{22}$). FIG. 7A illustrates an example embodiment breaking the leakage path. In FIG. 7A, a sample-and-hold circuit 700 is inserted between the last two stages. Note that in the embodiment of FIG. 7A, the sample-and-hold circuit sampling frequency ($2 \times f_{SW}$) is twice the switching frequency of the switched-capacitors ($f_{SW}$). FIG. 7B illustrates additional detail for an example embodiment of the sample-and-hold circuit 700. In FIG. 7B, the sample-and-hold circuit 700 is implemented as a cascade of two Track-and-Hold Amplifiers (THA's) 702 and 704. A first capacitor $C_{THA1}$ is charged (input is sampled) when a first switch $SW_{THA1}$ is closed. A second capacitor $C_{THA2}$ is charged (input is sampled) when a second switch $SW_{THA2}$ is closed. The switches are driven by complementary clock phases of the sample-and-hold clock, which is twice the frequency of the switched-capacitor filter clock. FIG. 7C illustrates example timing. In FIG. 7C, waveform 706 represents the ramp signal (output of ramp generator 104 in FIG. 1). Waveform 708 represents the switching-capacitor filter clock. Waveform 710 represents the sample-and hold clock. During time T1, $SW_{THA1}$ is closed (sample) and $SW_{THA2}$ is open (hold). During time T2, $SW_{THA1}$ is open (hold) and $SW_{TH42}$ is closed (sample). Since one switch is always open, no leakage occurs through the sample-and-hold circuit 700.

Figure 8A:
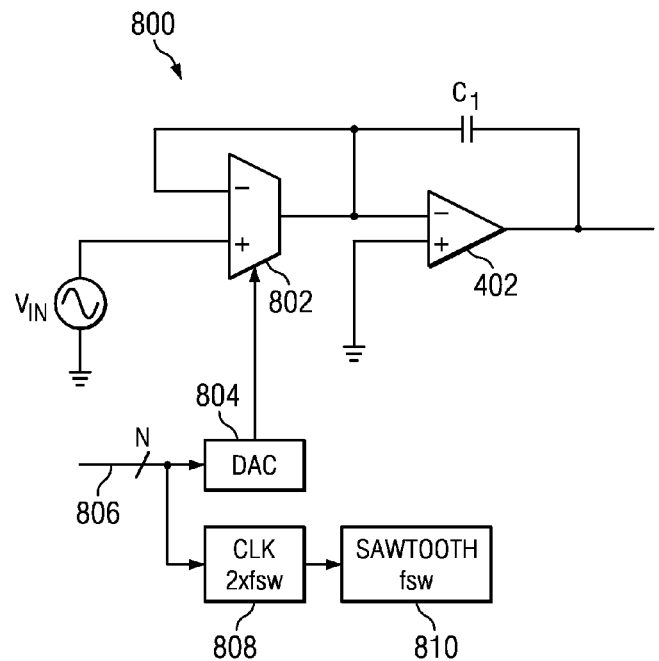
FIG. 8A is a simplified block diagram illustrating an example embodiment of a variation of part of the analog Type-III compensation filter of FIG. 4.

In the embodiment of FIG. 4, the first stage acts as an integrator for closed-loop control of the DC output of the Buck converter, and also as a continuous-time anti-aliasing filter (AAF) to suppress harmonics of the switching frequency of the Buck converter. The output of the Buck converter LC filter (FIG. 1) may still have substantial ripple at the switching frequency of the Buck converter. Preferably, the AAF attenuates the switching ripple of the Buck converter to provide a sufficient signal-to-noise ratio (SNR) to prevent aliasing distortion of the succeeding switched-capacitor filter stage. In addition, preferably the unity-gain bandwidth of the integrator (acting as AAF) automatically scales with switching frequency of the Buck converter, so that the SNR requirements are met for a wide range of Buck converter switching frequencies. FIG. 8A illustrates an example embodiment of the continuous-time integrator (first stage of FIG. 4) in which $R_1$ is implemented as a transconductance amplifier 802. The transconductance amplifier includes current sources that are controlled by a digital-to-analog converter (DAC) 804. The DAC input 806 is a digital value that also controls the frequency of a clock generator 808. Clock generator 808 generates a clock signal as in FIG. 7C, 710, that is twice the frequency of the switching clock signal (FIG. 7C, 708). Clock generator 808 also drives a sawtooth generator 810 (functionally corresponding to element 104 in FIG. 1), which generates a sawtooth waveform as in FIG. 7C, 706. Hence, the integrator bandwidth is made to linearly scale with the switching frequency of the DC-DC converter.

Figure 8C:
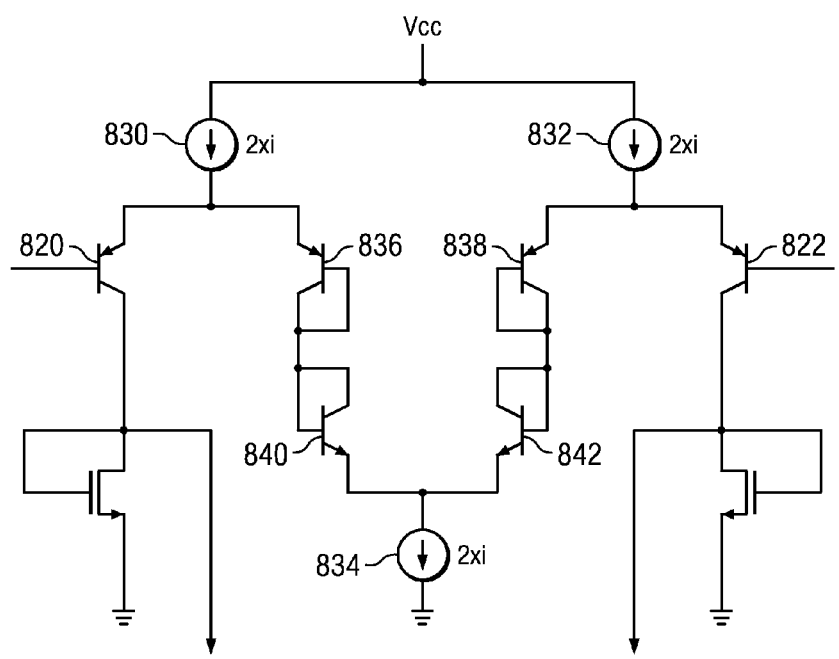
FIG. 8C is a simplified schematic illustrating additional detail for an example embodiment of a variation of part of the circuit of FIG. 8B.
Figure 8B:
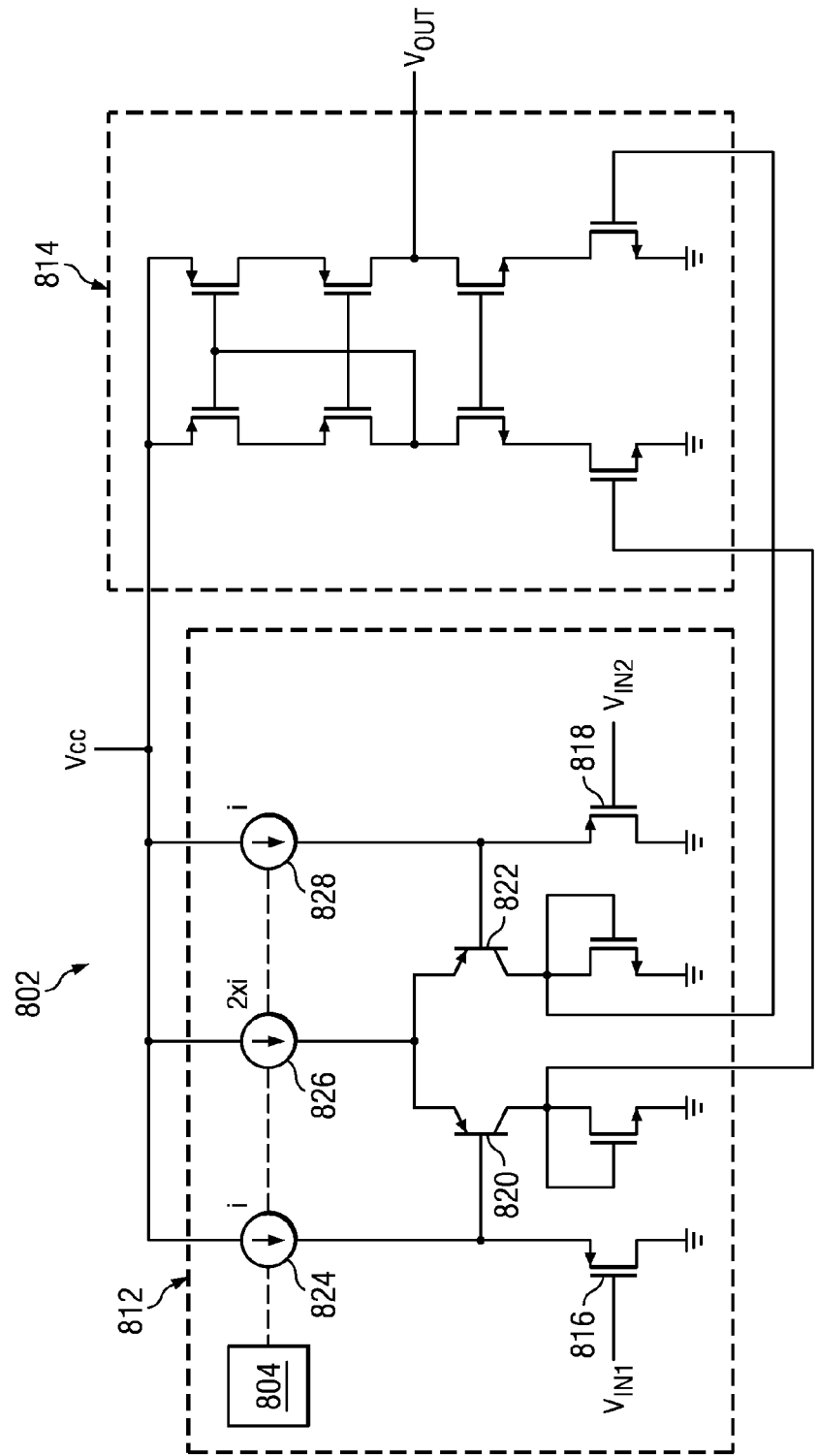
FIG. 8B is a simplified schematic illustrating additional detail for an example embodiment of part of the circuit of FIG. 8A.

FIG. 8B illustrates additional detail for an example embodiment of the transconductance amplifier 802. In the example of FIG. 8B, the transconductance amplifier comprises a transconductance stage 812 and an output stage 814. In FIG. 8B, the transconductance amplifier 802 receives two differential signals $V_{IN1}$ and $V_{IN2}$, and generates a single-ended output signal $V_{OUT}$. Transistors 816 and 818 function as buffers and level shifters. Two PNP bipolar junction transistors 820 and 822 provide the transconductance function. As temperature increases, the small-signal transconductance of bipolar junction transistors 820 and 822 decreases linearly. To compensate, current provided by current sources 824, 826, and 828 increases linearly with increasing temperature. In the current sources, a Bandgap Reference Voltage generator is used to generate a Proportional To Absolute Temperature (PTAT) current. The current sources are controlled by the current digital-to-analog converter 804 (see also FIG. 8A, 804).

The example transconductance amplifier 802 in FIG. 8B may exhibit non-linearity for large differential input voltages. Large differential input voltages may occur whenever there is a large line/load transient, and also during start-up. FIG. 8C illustrates an example variation of the transconductance stage 812 with improved linearity for large differential input voltages. In FIG. 8C, transistors 820 and 822 correspond to transistors 820 and 822 in FIG. 8B. In the example of FIG. 8C, there are three current sources 830, 832, and 834 replacing current source 826 in FIG. 8B. The input differential voltage is divided by additional differential stages (additional PNP differential stage (836, 838) and additional NPN differential stage (840, 842)). By dividing the input differential voltage over multiple bipolar differential stages, linearity is improved. In addition, the small signal transconductance is also reduced, resulting in a smaller integration capacitor (FIG. 4, C1) for a given time constant.

MOS transconductance circuits have been described before. However, for MOS transistors in saturation, linearity is a function of process parameters. The MOS transconductance can be made independent of process parameters by operating in weak inversion. For this, the bias current needs to be extremely small (nA range), which can result in poor frequency response due to low-frequency parasitic poles, resulting in phase degradation of closed-loop response. In some prior art bipolar junction transistor transconductor circuits, linearity is improved by placing multiple transconductors in parallel with built-in voltage offsets (called the multitan h principle). This approach requires a large integrated circuit area to ensure high linearity for input differential signals greater than 100 mV due to logarithmic dependence of offset voltage on area mismatch. The bipolar-junction-transistor-based transconductor circuit of FIG. 8C has better independence of process parameters and linear scaling compared to prior art MOS circuits, and the circuit of FIG. 8C has a lower integrated circuit area and better frequency response compared to prior art bipolar junction transistor circuits, and has better frequency response compared to prior art MOS circuits in weak inversion.

Although the invention has been described in detail, it should be understood that various changes, substitutions and alterations can be made thereto without departing from the spirit and scope of the invention as defined by the appended claims.

What is claimed is:

1. A filter, comprising:
   a plurality of cascaded active filter stages each comprising an amplifier;
   at least one active filter stage having a resistance in parallel with a capacitance at an input; and,
   the resistance being implemented as a double-sampled switched-capacitor circuit; and
   a sample-and-hold circuit located between a last one of the plurality of active filter stages and an active filter stage of the plurality of active filter stages preceding the last stage.

2. The filter of claim 1 where the resistance is implemented as a double-sampled T-network switched-capacitor circuit.

3. The filter of claim 2, wherein the double-sampled switched capacitor circuit operates on complementary phases and wherein for a first clock phase, a first T-network having three capacitors is coupled to an input of the amplifier of one of the active filter stages, and for a second clock phase, a second T-network having three capacitors is coupled to the input of the amplifier of that active filter stage.

4. The filter of claim 1, where the filter is a compensation filter suitable for use in a feedback loop of a DC-DC voltage converter.

5. The filter of claim 4, where the active filter stage is a Type-III compensation filter.

6. The filter of claim 4, where the active filter stage is a Type-II compensation filter.

7. The filter of claim 4, where all filter time constants all of the compensation filter track a switching-frequency of the DC-DC voltage converter.

8. A filter, comprising:
   a plurality of cascaded active filter stages;
   at least one active filter stage having a resistance in parallel with a capacitance at an input;
   the resistance being implemented as a double-sampled switched-capacitor circuit;
   the plurality of active filter stages further comprising an integration stage, the integration stage including an integration resistance, and the integration resistance implemented as a transconductance amplifier which comprises a bipolar junction transistor differential input stage where a differential input voltage is divided by at least two additional series bipolar junction transistor differential input stages.

9. The filter of claim 8, wherein the filter is a compensation filter suitable for use in a feedback loop of a DC-DC voltage converter and wherein a cutoff frequency of the integration stage tracks a switching frequency of a DC-DC voltage converter.

10. The filter of claim 9, where the transconductance amplifier includes a current source, and where the current source is controlled by a digital-to-analog converter.

11. The filter of claim 10, where a digital input signal for the digital-to-analog converter also controls the switching frequency of DC-DC voltage converter.

12. The filter of claim 10, where the current generated by the current source is proportional to absolute temperature.

\* \* \* \* \*